United States Patent
Park et al.

(10) Patent No.: US 8,772,855 B2
(45) Date of Patent: Jul. 8, 2014

(54) SEMICONDUCTOR DEVICE INCLUDING RESISTOR AND METHOD OF FABRICATING THE SAME

(75) Inventors: Yoonmoon Park, Seoul (KR); Keonsoo Kim, Hwaseong-si (KR); Jinhyun Shin, Suwon-si (KR); Jae-Hwang Sim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 470 days.

(21) Appl. No.: 12/882,436

(22) Filed: Sep. 15, 2010

(65) Prior Publication Data

US 2011/0062508 A1 Mar. 17, 2011

(30) Foreign Application Priority Data

Sep. 15, 2009 (KR) ........................ 10-2009-0087064

(51) Int. Cl.
*H01L 29/788* (2006.01)

(52) U.S. Cl.
USPC ........... 257/316; 257/315; 257/319; 257/510; 257/3; 257/40; 257/390; 438/266; 438/382; 438/258; 438/230

(58) Field of Classification Search
USPC ........ 257/314–322, 510, 3, 40, 390; 438/266, 438/382, 258, 230
See application file for complete search history.

(56) References Cited

U.S. PATENT DOCUMENTS

| | | | | |
|---|---|---|---|---|
| 5,400,277 | A * | 3/1995 | Nowak | 365/154 |
| 7,045,413 | B2 * | 5/2006 | Lee et al. | 438/230 |
| 7,667,220 | B2 * | 2/2010 | Ho et al. | 257/4 |
| 7,884,346 | B2 * | 2/2011 | Mikawa et al. | 257/4 |
| 8,101,988 | B2 * | 1/2012 | Nakagawa | 257/314 |
| 2001/0025973 | A1 * | 10/2001 | Yamada et al. | 257/296 |
| 2002/0118465 | A1 * | 8/2002 | Hosoe | 359/642 |
| 2005/0142756 | A1 * | 6/2005 | Park et al. | 438/258 |
| 2005/0269663 | A1 * | 12/2005 | Minami et al. | 257/510 |
| 2006/0054953 | A1 * | 3/2006 | Son et al. | 257/296 |
| 2006/0118855 | A1 * | 6/2006 | Lee et al. | 257/315 |
| 2007/0059447 | A1 * | 3/2007 | Kim et al. | 427/250 |
| 2007/0117327 | A1 * | 5/2007 | Lee et al. | 438/266 |
| 2008/0048242 | A1 * | 2/2008 | Choi et al. | 257/315 |
| 2008/0079091 | A1 * | 4/2008 | Park et al. | 257/390 |
| 2008/0272355 | A1 * | 11/2008 | Cho et al. | 257/2 |
| 2009/0051008 | A1 | 2/2009 | Shin et al. | |
| 2009/0294823 | A1 * | 12/2009 | Lee et al. | 257/314 |
| 2010/0006914 | A1 * | 1/2010 | Nakagawa | 257/304 |

(Continued)

FOREIGN PATENT DOCUMENTS

| | | |
|---|---|---|
| JP | 2008-066593 A | 3/2008 |
| JP | 2009-055029 A | 3/2009 |

(Continued)

*Primary Examiner* — Fernando L Toledo
*Assistant Examiner* — Mohammed Shamsuzzaman
(74) *Attorney, Agent, or Firm* — Lee & Morse, P.C.

(57) ABSTRACT

Embodiments of a semiconductor device including a resistor and a method of fabricating the same are provided. The semiconductor device includes a mold pattern disposed on a semiconductor substrate to define a trench, a resistance pattern including a body region and first and second contact regions, wherein the body region covers the bottom and sidewalls of the trench, the first and second contact regions extend from the extending from the body region over upper surfaces of the mold pattern, respectively; and first and second lines contacting the first and second contact regions, respectively.

20 Claims, 11 Drawing Sheets

(56) References Cited

U.S. PATENT DOCUMENTS

| | | | |
|---|---|---|---|
| 2010/0008132 A1* | 1/2010 | Hwang et al. | 365/163 |
| 2010/0176365 A1* | 7/2010 | Park et al. | 257/3 |
| 2010/0264392 A1* | 10/2010 | Kawashima et al. | 257/2 |
| 2010/0320453 A1* | 12/2010 | Tanaka et al. | 257/40 |
| 2011/0233503 A1* | 9/2011 | Hwang | 257/2 |
| 2011/0284945 A1* | 11/2011 | Fukumura et al. | 257/316 |
| 2012/0040508 A1* | 2/2012 | Oh et al. | 438/382 |

FOREIGN PATENT DOCUMENTS

| | | |
|---|---|---|
| KR | 10-0669346 B1 | 1/2007 |
| KR | 10-2007-0070870 A | 7/2007 |
| KR | 10-2007-0082991 A | 8/2007 |
| KR | 10-2008-0036830 A | 4/2008 |
| KR | 10-2009-0020329 A | 2/2009 |

* cited by examiner

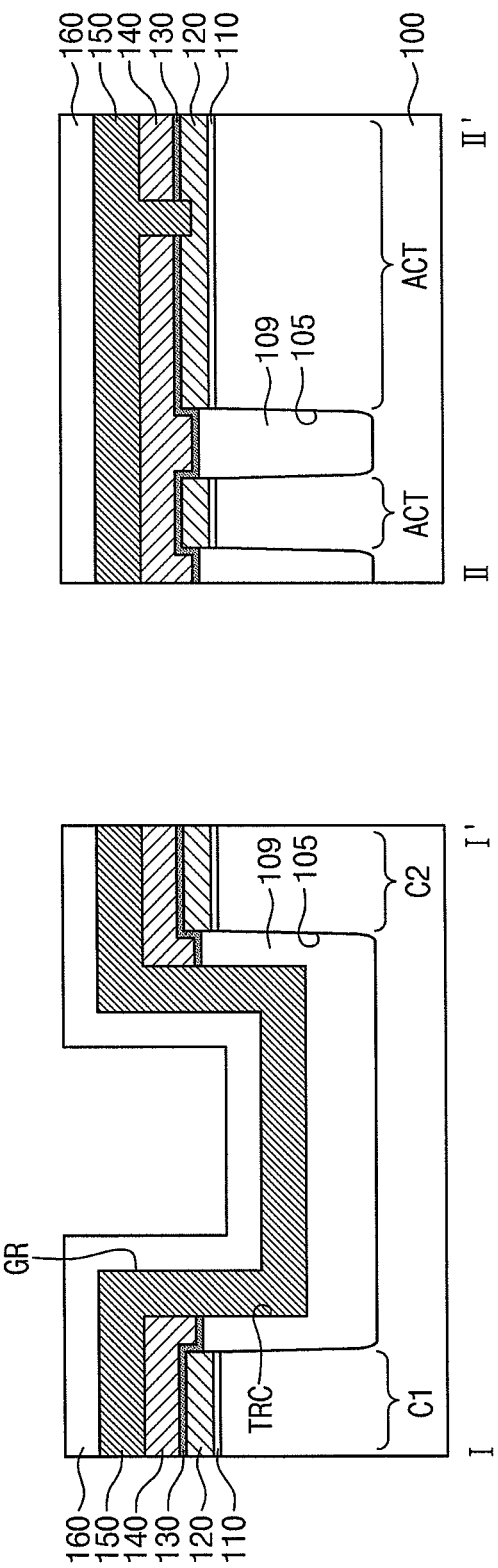

SEMICONDUCTOR DEVICE INCLUDING RESISTOR AND METHOD OF FABRICATING THE SAME

BACKGROUND

1. Field

The present disclosure herein relates to a semiconductor device and a method of forming the same and more particularly to, a semiconductor device with a resistor and a method of fabricating the same.

2. Description of the Related Art

A semiconductor memory device for data storage is typically classified into a volatile memory device and a non-volatile memory device. Volatile memory devices lose their stored data once power supply is cut off, but non-volatile memory devices, such as flash memory devices, retain their stored data even when power supply is cut off.

The flash memory device may include a cell array region including a plurality of memory cell transistors for data storage and a peripheral circuit region including a driving circuit for driving the cell transistors. The peripheral circuit region may include a resistor for adjusting a reference voltage during program, erase, and read operations of the memory cell transistor.

In cases in which a resistor is used for adjusting the reference voltage, the resistance value of the resistance needs to be stably maintained within a required range. To meet this requirement, influence by a contact resistance between the resistance pattern and line should be minimized such that a resistance value of the resistor may be mainly determined based on a resistance of a resistance pattern.

SUMMARY

Embodiments are therefore directed to semiconductor devices and methods of fabricating semiconductor devices, which substantially overcome one or more of the problems due to the limitations and disadvantages of the related art.

It is therefore a feature of an embodiment to provide a semiconductor device including a resistor that reduces influence caused by contact resistance.

It is therefore another feature of an embodiment to provide a method of fabricating a semiconductor device including a resistor that reduces influence caused by contact resistance.

At least one of the above and other features and advantages may be realized by providing a semiconductor device, including a mold pattern disposed on a semiconductor substrate to define a trench, a resistance pattern including a body region and first and second contact regions, the body region covering a bottom and sidewalls of the trench, the first and second contact regions extending from the body region over upper surfaces of the mold pattern, respectively, and first and second lines contacting the first and second contact regions, respectively.

The semiconductor device may include first conductive pattern disposed between the first line and the first contact region, and a second conductive pattern disposed between the second line and the second contact region.

Bottom and sidewalls of the body region define a gap region on the trench, and the semiconductor device may further include an insulation layer structure to expose top surfaces of the first and second contact regions and fill the gap region.

The semiconductor substrate may include a resistance region where the resistance pattern is formed and a cell array region where memory cells are formed, the memory cell includes a lower gate structure and a upper gate structure, which may be sequentially stacked on the semiconductor substrate, the lower gate structure includes a tunnel insulation layer and a floating gate electrode, which may be sequentially stacked, and the mold pattern includes a first thin layer structure including a same material as the lower gate structure.

The upper gate structure may include a gate interlayer insulation layer, a first control electrode, a second control electrode, and a third control electrode, which may be sequentially stacked, the mold pattern may further include a second thin layer structure formed of the same material as the gate interlayer insulation layer and the first control electrode, and the resistance pattern includes of a same material as the second control electrode.

The semiconductor device may further include a first conductive pattern disposed between the first line and the first contact region, and a second conductive pattern disposed between the second line and the second contact region, wherein the first and second conductive patterns may include a same material as the third control electrode.

The semiconductor device may further include a device isolation layer disposed between the body region of the resistance pattern and the semiconductor substrate, wherein the device isolation layer may include a middle portion below the body region and a sidewall extending from the middle portion to between the first thin layer structure and the body region.

At least one of the above and other features and advantages may be separately realized by providing a method of fabricating a semiconductor device, the method including forming a mold pattern on a semiconductor substrate to define a trench, forming a resistance pattern on the mold pattern to cross over the trench, forming respectively spaced first and second conductive patterns on the resistance pattern, and forming first and second lines to contact the first and second conductive patterns, respectively, wherein the first and second conductive patterns are formed on upper surfaces of the mold pattern, respectively.

Forming of the resistance pattern may include forming a resistance layer on the semiconductor substrate, the resistance layer covering the mold pattern conformally and defining a gap region on the trench, forming a filling insulation layer on the resistance layer to fill the gap region, and forming an insulation layer structure to expose a top surface of the resistance layer by etching the filling insulation layer and fill the gap region locally, wherein forming of the first and second conductive patterns may include forming silicide patterns locally on the top surface of the exposed resistance layer by performing a silicide process.

The semiconductor substrate may include a resistance region where the resistance pattern is formed and a cell array region where memory cells are disposed, the memory cell includes a lower gate structure and a upper gate structure, which are sequentially stacked on the semiconductor substrate, the lower gate structure includes a tunnel insulation layer and a floating gate electrode, which are sequentially stacked, the upper gate structure includes a gate interlayer insulation layer, a first control electrode, a second control electrode, and a third control electrode, which are sequentially stacked, the mold pattern may be formed using a process for forming the lower gate structure, the gate interlayer insulation layer, and the first control electrode, the resistance pattern may be formed using a process for forming the second control electrode, and the first and second conductive patterns may be formed using a process for forming the third control electrode.

At least one of the above and other features and advantages may be separately realized by providing a semiconductor device, including a trench structure disposed on a semiconductor substrate, the trench structure including upper surfaces, wall surfaces, and a lower surface defining a trench, a resistance pattern disposed on the trench structure, the resistance pattern including a body region covering at least a portion of the wall surfaces and the lower surface of the trench, and first and second contact regions respectively covering the upper surfaces of support pattern and the body region being electrically coupled to the first and second contract regions of the resistance pattern, and first and second lines contacting the first and second contact regions, respectively, wherein the resistance pattern defines a gap region between facing portions of the body region.

The semiconductor device may further include a first conductive pattern disposed between the first line and the first contact region, and a second conductive pattern disposed between the second line and the second contact region.

A resistance of the first and second conductive patterns may be lower than a resistance of the resistance pattern.

The semiconductor device may further include conductive plugs electrically coupling respective ones of the first and second contact regions to the first and second lines, respectively, the conductive plugs may contact only the corresponding first or second contact region of the resistance pattern.

The semiconductor device may further include an insulation layer filling the gap region.

The trench structure may correspond to a device isolation layer pattern formed on the semiconductor substrate and at least one gate layer may extend between at least a portion of the device isolation layer pattern and at least one of the first and second contact regions. The at least one gate pattern may include a tunnel insulation layer, a floating gate conductive layer, a gate interlayer insulation layer, and/or a first conductive layer.

The resistance pattern may directly contact the first conductive layer.

The device isolation layer pattern may extend between the resistance pattern and the floating gate conductive layer and/or the tunnel insulation layer.

The resistance pattern may be U-shaped.

BRIEF DESCRIPTION OF THE DRAWINGS

The above and other features and advantages will become more apparent to those of ordinary skill in the art by describing in detail exemplary embodiments with reference to the attached drawings, in which:

FIGS. 7A, 8A, 9A, 10A, 11A, and 12A illustrate sectional views of resulting structures of stages in a method of manufacturing a semiconductor device, taken along the dotted lines I-I' of FIG. 6, and FIGS. 7B, 8B, 9B, 10B, 11B, and 12B illustrate sectional views of resulting structures of stages in a method of manufacturing a semiconductor device, taken along dotted lines II-II' of FIG. 5;

DETAILED DESCRIPTION

Figure 1:
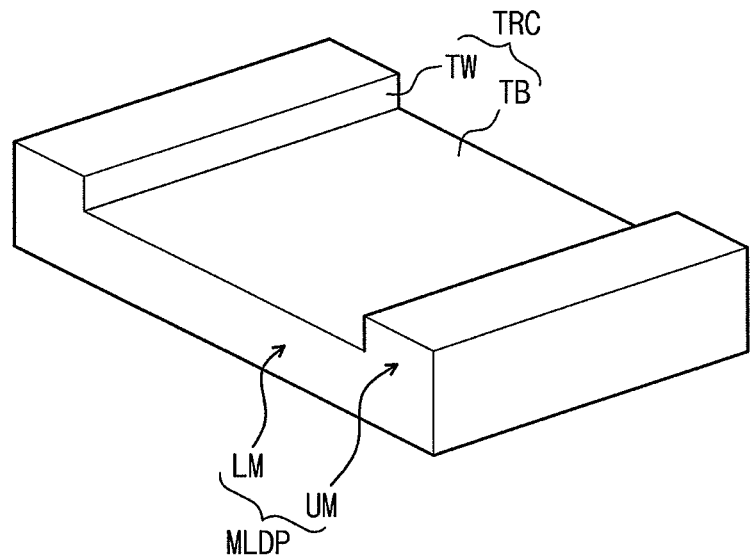
FIGS. 1, 2, 3, and 4 illustrate perspective views of resulting structures of stages in a manufacturing method of a semiconductor device according to an embodiment of the inventive concept.

Korean Patent Application No. 10-2009-0087064, filed on Sep. 15, 2009 in the Korean Intellectual Property Office, and entitled: "Semiconductor Device Including Resistor and Method of Fabricating the Same," is incorporated by reference herein in its entirety.

Hereinafter, embodiments of the inventive concept will be described with reference to the accompanying drawings. The object(s), feature(s), and advantage(s) of the inventive concept will be understood without difficulties through preferred embodiments below related to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like components in the drawings and specification.

In the specification, when it is mentioned that a certain element such as a conductive layer, a semiconductor layer, or an insulation layer is disposed "on" another element, e.g., a substrate, the certain element may be directly formed on the another element, or one or more other elements may be interposed therebetween. In addition, it will also be understood that when an element is referred to as being "between" two elements, it can be the only element between the two elements, or one or more intervening elements may also be present.

Also, though terms like a first, a second, and a third are used to describe various regions and layers in various embodiments of the inventive concept, the regions and the layers are not limited to these terms. Moreover, these terms are merely used to distinguish a certain predetermined portion from other portions. Therefore, a portion referred to as a first portion in one embodiment can be referred to as a second portion in another embodiment. It should be understood that the terms 'and/or' of this specification refer to one or all of components listed before and after the terms 'and/or'.

FIGS. 1, 2, 3, and 4 illustrate perspective views of resulting structures of stages in a manufacturing method of a semiconductor device according to an embodiment of the inventive concept.

Figure 2:
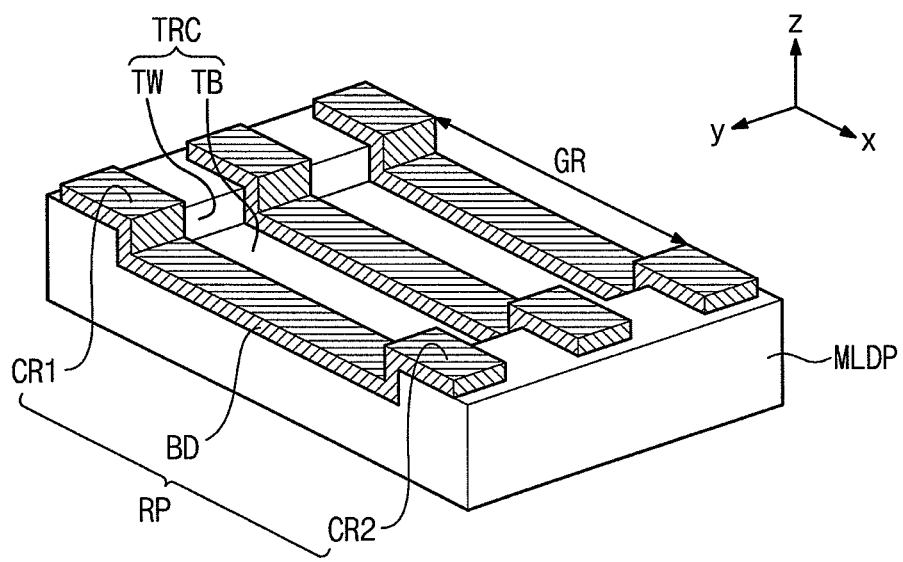

Referring to FIGS. 1 and 2, a mold pattern MLDP having a trench TRC may be formed. A resistance pattern RP may be formed on the mold pattern MLDP having the trench TRC.

Referring to FIG. 1, a lower portion LM and upper portions UM of the mold pattern MLDP may define the trench TRC. More particularly, the lower portion LM of the mold pattern MLDP may define a bottom surface TB of the trench TRC and sidewalls TW of the trench TRC extending between corresponding upper portions UM of the mold pattern MLDP. The lower portion LM of the mold pattern MLDP may correspond to portions of the mold pattern MLDP that are lower, relative to a z-axis, than the upper portions UM of the mold pattern MLDP. More particularly, the trench TRC may be defined between corresponding upper portions UM of the mold pattern MLDP. The upper portions UM of the mold pattern MLDP may correspond to upper surfaces of the mold pattern MLDP extending beyond sidewalls TW of the trench TRC.

The resistance pattern RP may include a plurality of contact regions CR and a body region BD. The contact regions CR of the resistance pattern RP may be arranged on relatively higher portions of the mold pattern MLDP relative to a z-axis. For example, the contact regions CR of the resistance pattern RP may be arranged on the upper portions UM of the mold pattern MLDP, and the body regions BD may be arranged on relatively lower portions LM of the mold pattern MLDP, e.g., the sidewalls TW and the bottom surface TB of the trench TRC.

More particularly, e.g., the resistance pattern RP may include a plurality of first and second contact regions CR1 and CR2 with the body regions BD extending therebetween. In embodiments including a plurality of resistance patterns RP, respective ones of the body regions BD may extend between corresponding ones of the first and second contact regions CR1 and CR2. The first and second contact regions CR1 and CR2 may be spaced apart from each other. Referring to FIG. 2, the body region BD may extend between corresponding ones of the first and second contact regions CR1 and CR2 along surfaces, e.g., TB, TW, of the trench TRC. The first and second contact regions CR1 and CR2 may cover a portion of the upper portion UM of the mold pattern MLDP and upper ends of the respective sidewalls TW. Further, corresponding upper surfaces of the resistance patterns RP may define a gap region GR within the trench TRC.

The resistance pattern RP may be substantially formed with a conformal thickness. Accordingly, the first and second contact regions CR1 and CR2 of the resistance pattern RP may have top surfaces disposed substantially higher, e.g., relative to the z-axis, than top surfaces of the corresponding body portion BD.

As shown in the drawings, a plurality of resistance patterns RP crossing over the trench TRC may be formed on the mold pattern MLDP. The resistance patterns RP may include one or more conductive materials. More particularly, e.g., the resistance pattern RP may include polycrystalline silicon, metals, metal silicides, and/or metal nitrides.

Figure 3:
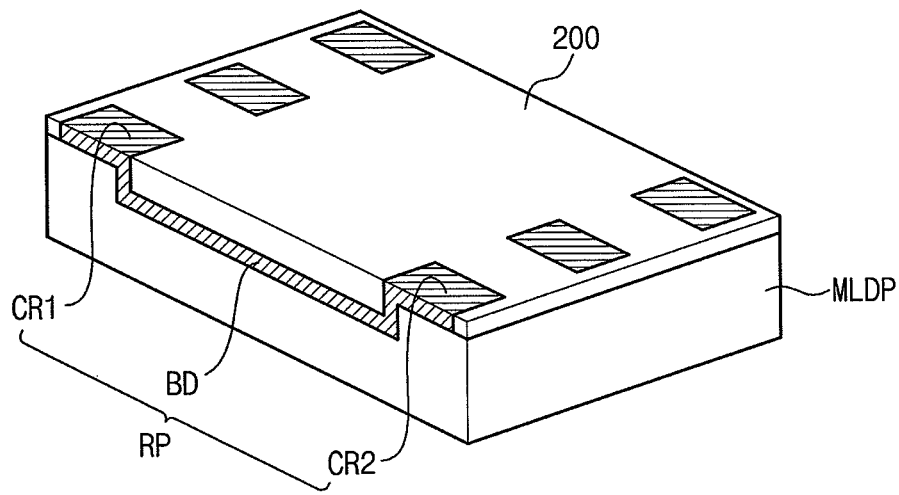
Figure 4:
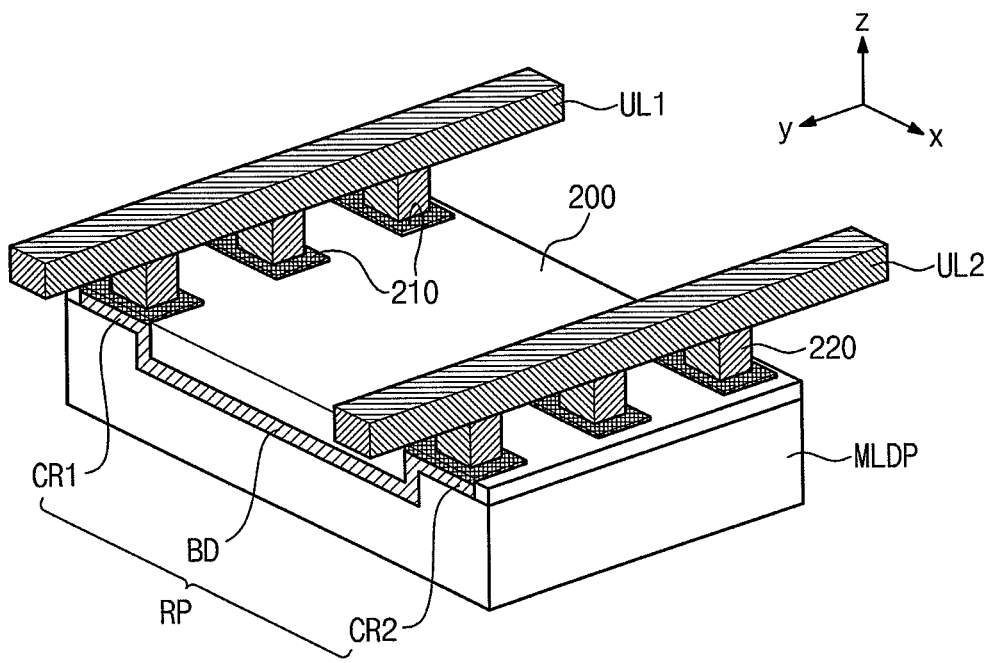

Referring to FIGS. 3 and 4, an insulation layer 200 may be formed on the resistance pattern RP. In embodiments, after forming the insulation layer 200, a portion of the insulation layer 200 may be etched to expose a top surface of the resistance pattern RP. Etching of the insulation layer 200 may be performed using one of wet blanket etching, dry blanket etching, and chemical mechanical polishing (CMP). More particularly, e.g., the top surface of the contract regions CR1, CR2 of the resistance patterns RP may be exposed and may extend along a same plane as a top surface of the insulation layer 200.

Referring still to FIGS. 3 and 4, conductive patterns 210 and plugs 220 may be formed on the exposed resistance pattern RP. Upper lines UL1 and UL2 may be formed on the conductive patterns 210 and the plugs 220. The upper lines UL1 and UL2 may contact the plugs 220. The conductive patterns 210 may be locally formed on the top surface of the exposed resistance pattern RP. The conductive patterns 220 may include one or more materials having a lower resistivity than that of the resistance pattern RP. For example, the resistance pattern RP may be a polycrystalline silicon layer and the conductive patterns 210 may be a silicide layer.

The plugs 220 and the upper lines UL1 and UL2 may include conductive material, e.g., a metallic material, having a lower resistivity than that of the resistance pattern RP. In some embodiments, one (e.g., UL1) of the upper lines UL1 and UL2 may be electrically connected to the conductive pattern 210 formed on the first contact region CR1 of the resistance pattern RP, and the other one (e.g., UL2) may be electrically connected to the conductive pattern 210 formed on the second contact region CR2 of the resistance pattern RP. That is, the upper lines UL1 and UL2 may respectively contact both ends of the resistance pattern RP and may be electrically separated from each other.

The resistance pattern RP may include, e.g., a polycrystalline silicon layer. The conductive patterns 210 may include, e.g., a silicide layer formed using a self-aligned silicide formation technique. As mentioned above, the first and second contact regions CR1 and CR2 of the resistance pattern RP may have top surfaces that are higher, relative to the z-axis, than the top surface of the body portion BD. Accordingly, when the self-aligned silicide formation technique is used, regions where the conductive pattern 210 may be formed may be limited to the top portion of the first and second contact regions CR1 and CR2 of the resistance pattern RP. That is, the conductive patterns 210 may not be formed on the body region BD of the resistance pattern RP.

As mentioned above, the conductive pattern 210 may have a lower resistivity than that of the resistance pattern RP and may be interposed between the plug 220 and the resistance pattern RP. Accordingly, a contact resistance between the plug 220 and the resistance pattern RP may be reduced. Furthermore, the conductive pattern 210 may not be formed on the body region BD of the resistance pattern RP. The conductive pattern 210 may be locally formed on the top portions of the first and second contact regions CR1 and CR2. Accordingly, an entire resistance value of the resistor may be mainly determined by a resistance value of the body region BD of the resistance pattern RP. That is, influence of the contact resistance between the plug 220 and the resistance pattern RP, with respect to an entire resistance value of the resistor, may be reduced.

Figure 5:
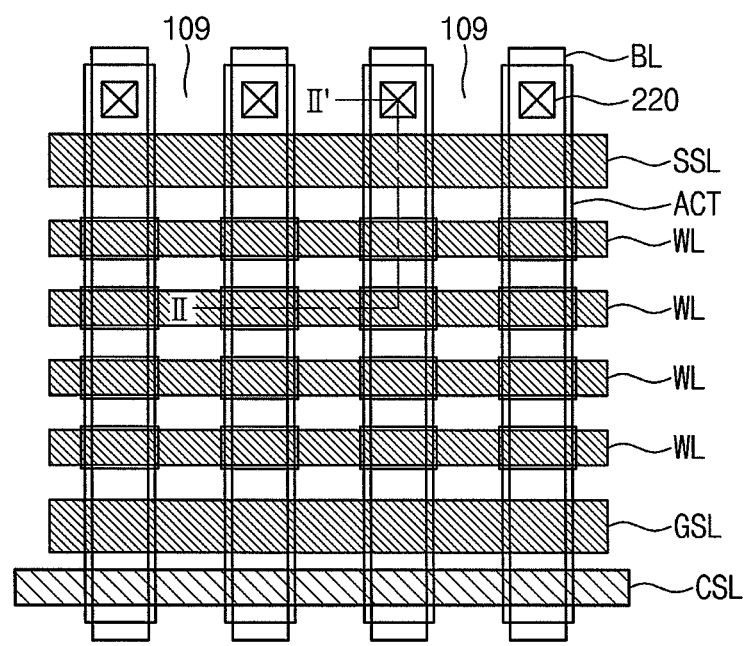
FIGS. 5 and 6 illustrate plan views of a cell array region and a resistor region of a semiconductor device according to another embodiment of the inventive concept.
Figure 6:
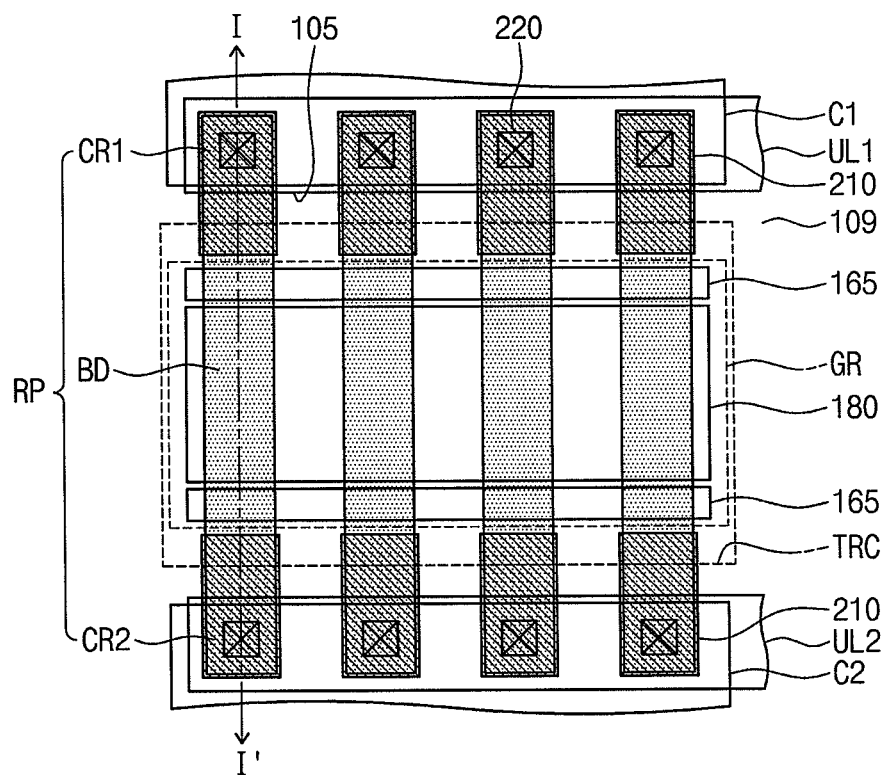

FIGS. 5 and 6 illustrate plan views of a cell array region and a resistor region of a semiconductor device according to another embodiment of the inventive concept. More particularly, FIGS. 5 and 6 illustrate plan views related to embodiments to which the technical scope of the inventive concept is applied to realize a NAND flash memory device with FIG. 5 illustrating a plan view of a portion of a cell array region of a NAND flash memory device, and FIG. 6 illustrating a plan view of a resistor region of a NAND flash memory device.

Referring to FIG. 5, device isolation layer patterns 109 may be disposed on a cell array region to define active regions ACT. A gate line structure that may cross the device isolation layer patterns 109 may be disposed on the active regions ACT. The gate line structure may include a string selection line SSL, a ground selection line GSL, and a plurality of word lines WL disposed therebetween. Bit line plugs 220 that may contact the active regions ACT may be disposed on one side of the gate line structure. A common source line CSL that may cross over the device isolation patterns 109 and may contact the active regions ACT may be disposed on the other side of the gate line structure. Bit lines BL may be electrically connected to the active regions ACT through the bit line plugs 220 and may cross over the word lines WL. The bit lines BL may be disposed on the top portion of the gate line structure.

The respective word lines WL may be used as a gate electrode of a respective memory cell transistor. The ground selection line GSL may be used as a gate electrode of a ground selection transistor controlling an electrical connection between the common source line CSL and the memory cell transistor. The string selection line SSL may be used as a gate electrode of the string selection transistor controlling an electrical connection between the bit line BL and the memory cell transistor.

Referring to FIG. 6, the device isolation layer patterns 109 defining the respectively-spaced connection regions C1 and C2 may be formed on a resistor region. At least one resistance pattern RP may be disposed to cross over the device isolation layer pattern 109. The resistance pattern RP may include first and second contact regions CR1 and CR2 and may be formed on the connection regions C1 and C2, respectively, and a body region BD formed therebetween. A first upper line UL1 connecting the first contact regions CR1 and a second upper line UL2 connecting the second contact regions CR2 may be disposed on the connection regions C1 and C2, respectively.

The resistance pattern RP may include conductive materials, e.g., polycrystalline silicon, metals, metal silicides, and/or metal nitrides. Conductive patterns 210 having a lower resistivity than that of the resistance pattern RP may be disposed between the first upper line UL1 and the first contact region CR1 of the resistance pattern RP and between the second upper line UL2 and the second contact region CR2 of the resistance pattern RP.

As discussed above, the resistance patterns RP may cross over a trench TRC. The trench TRC may correspond to the device isolation pattern 109. As shown in FIG. 6, the resistance patterns RP may be formed between the connection regions C1 and C2 and the body regions BD of the resistance patterns RP cover inner walls and/or surfaces of the trench TRC. Upper or exposed surfaces of the body region BD of the resistance pattern RP may define the gap region GR. The gap region GP may be filled by a capping pattern 165 and a filling insulation layer 180.

According to an embodiment, the conductive patterns 210 may extend on the respective contact region CR1, CR2 and/or a portion of the body region BR of the respective resistance pattern RP. For example, the conductive patterns 210 may extend from the top surface of the connection regions C1 and C2 to a boundary of the gap region GR. The conductive patterns 210 may overlap all and/or substantially all of a top surface of the resistance pattern RP and, more particularly, all and/or substantially all of the respective contact regions CR1, CR2 of the resistance pattern RP. In some embodiments, the conductive patterns 210 may not cover any portion of the body region BD of the resistance pattern RP and/or may be outside of the gap region GR.

FIGS. 7A, 8A, 9A, 10A, 11A, and 12A illustrate sectional views of resulting structures of stages in a method of manufacturing a semiconductor device, taken along the dotted lines I-I' of FIG. 6, and FIGS. 7B, 8B, 9B, 10B, 11B, and 12B illustrate sectional views of resulting structures of stages in a method of manufacturing a semiconductor device, taken along dotted lines II-II' of FIG. 5.

Figure 7A:
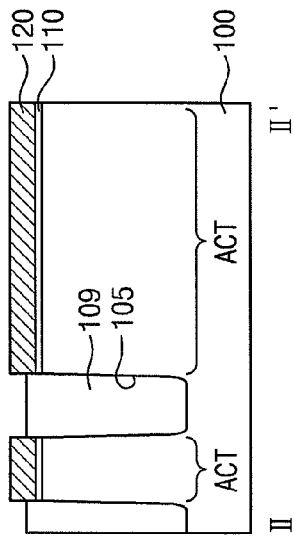
Figure 7B:
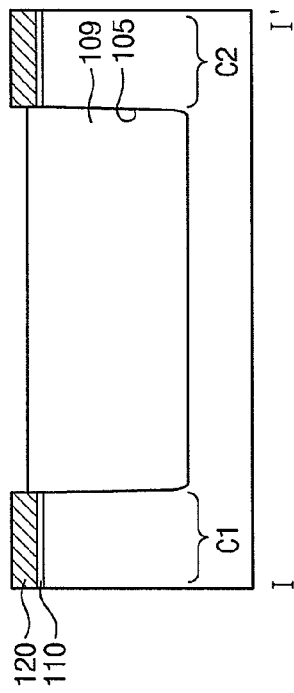

Referring to FIGS. 7A and 7B, a semiconductor substrate 100 including a cell array region and a resistor region may be provided. Active regions ACT may be defined in the cell array region. Device isolation layer patterns 109 defining first and second connection regions C1 and C2 may be formed in the resistor region. A tunnel insulation layer 110 and a floating gate conductive layer 120 may be sequentially formed on the active regions ACT and the first and second connection regions C1 and C2.

Forming the device isolation layer patterns 109 may include forming device isolation trenches 105 for defining the active regions ACT and the first and second connection regions C1 and C2, forming a device isolation layer for filling the device isolation trenches 105, and performing a planarization etching process on the device isolation layer. According to an embodiment, forming the device isolation trenches 105 may include forming the tunnel insulation layer 110 and the floating gate conductive layer 120 on the semiconductor substrate 100 to expose the top surface of the semiconductor substrate 100 in regions where the device isolation layer patterns 109 are to be formed and etching the exposed top surface of the semiconductor substrate 100 by using the tunnel insulation layer 110 and the floating gate conductive layer 120 as an etching mask. According to another embodiment, the tunnel insulation layer 110 and the floating gate conductive layer 120 may be formed after the device isolation layer patterns 109 are formed.

The semiconductor substrate 100 may be, e.g., a single crystal silicon wafer. The tunnel insulation layer 110 may be, e.g., a silicon oxide layer formed using a thermal oxidation process. The floating gate conductive layer 120 may be, e.g., a polycrystalline silicon layer. The device isolation patterns 109 may include a silicon oxide layer, a silicon nitride layer, a silicon oxide nitride layer, and/or a silicon layer. For example, the device isolation layer pattern 109 may include a filling insulation layer including a thermal oxide layer, a silicon nitride layer liner, and/or a high density plasma oxide layer, which cover inner walls of the device isolation trenches 105. However, the above description about materials of a thin layer is provided to realize embodiments of the technical ideas of the inventive concept and the embodiments may be variously modified. For example, in some embodiments, the tunnel insulation layer 110 may include, e.g., high-k layers. In some embodiments, the floating gate conductive layer 120 may be replaced with an insulation layer, e.g., a silicon nitride layer having abundant charge trap sites.

Figure 8A:
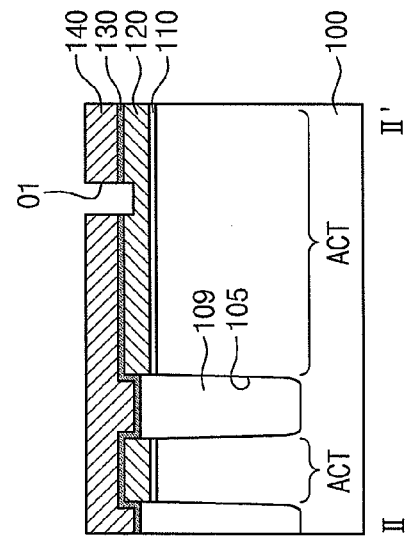
Figure 8B:
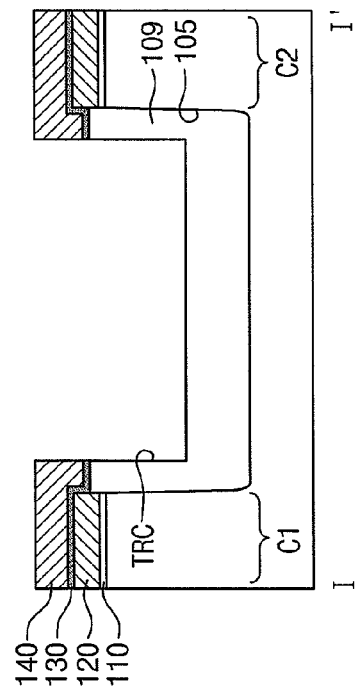

Referring to FIGS. 8A and 8B, a gate interlayer insulation layer 130 and a first conductive layer 140 may be sequentially formed on the semiconductor substrate 100. A first opening O1 may be formed to expose the top surface of the floating gate conductive layer 120 by patterning the first conductive layer 140, the gate interlayer insulation layer 130 and the device isolation layer pattern 109. The first opening unit O1 may be formed in the cell array region, more specifically, in a position where the string and ground selection lines SSL and GSL are formed.

The gate interlayer insulation layer 130 may include a silicon oxide layer and/or a silicon nitride layer. For example, the gate interlayer insulation layer 130 may include a silicon oxide layer, a silicon nitride layer, and/or a silicon oxide nitride layer, which are sequentially stacked. In some embodiments, the floating gate conductive layer 120 may include an insulation thin layer including abundant charge trap sites, and the gate interlayer insulation layer 130 may include high-k layers, e.g., an aluminum oxide layer. The first conductive layer 140 may include conductive materials such as polycrystalline silicon.

Referring still to FIGS. 8A and 8B, the trench TRC may be formed by recessing the top surface of the device isolation layer pattern 109 in the resistor region. The trench TRC may be formed using a process for forming the first opening O1. For example, forming the first opening O1 may include exposing the device isolation layer pattern 109 of the resistor region by etching the gate interlayer insulation layer 130 and the first conductive layer 140 on the device isolation layer pattern 109 of the resistor region. Then, the exposed device isolation layer patterns 109 may be anisotropically etched by using an etching recipe having an etching selectivity with respect to the floating gate conductive layer 120. As a result, the trench TRC may be formed between the first and second connection regions C1 and C2. As illustrated in the drawings, an inner wall of the trench TRC may be formed being spaced apart from an inner wall of the device isolation trench 105.

In such embodiments, the device isolation layer pattern 109 may be U-shaped and the trench TRC may be formed on a top middle surface of the device isolation pattern 109. That is, the device isolation layer pattern 109 may define the trench TRC and may include a middle portion below the trench TRC and a sidewall portion extending upward from sides of the middle portion so as to cover the device isolation trench 105 and/or or portions of the tunnel insulation layer 110 and/or the floating gate conductive layer 120.

Referring to FIGS. 9A and 9B, a second conductive layer 150 and a capping layer 160 may be sequentially formed on the semiconductor substrate 100. The second conductive layer 150 may include a conductive material, e.g., polycrystalline silicon. According to an embodiment, the second conductive layer 150 may be used as a resistance pattern constituting a resistor according to the inventive concept. The second conductive layer 150 may include, e.g., polycrystalline silicon doped with a predetermined impurity concentration and the impurity concentration may be selected to realize a required resistance value of the resistor. The capping layer 160 may include, e.g., a silicon nitride layer, a silicon oxide layer, and/or a silicon oxide nitride layer.

Referring to FIGS. 9A and 9B, the second conductive layer 150 may be conformally formed over the semiconductor substrate 100. In such embodiments, the conformally formed second conductive layer 150 and the conformally formed capping layer 160 over the trench TRC may define the gap region GR. The second conductive layer 150 may be formed with, e.g., half a thickness than that of a width of the trench TRC in order to allow the gap region GR to exist on the trench TRC.

As mentioned above, the first opening O1 may be formed in the cell array region, e.g., where the string and ground selection lines SSL and GSL may be formed, to expose the top surface of the floating gate conductive layer 120. Thus, the second conductive layer 150 may be formed to directly contact the floating gate conductive layer 120 through the first opening O1. Embodiments are not limited thereto. For example, in some embodiments, the second conductive layer 150 may be formed directly on the gate interlayer insulation layer 130, e.g., without the first conductive layer 140.

Figure 10A:
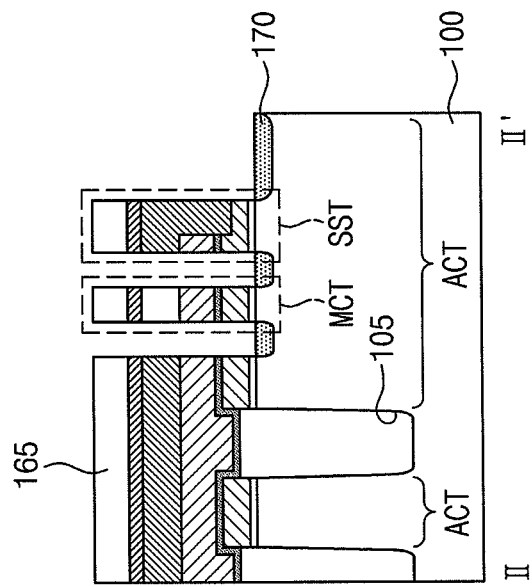
Figure 10B:
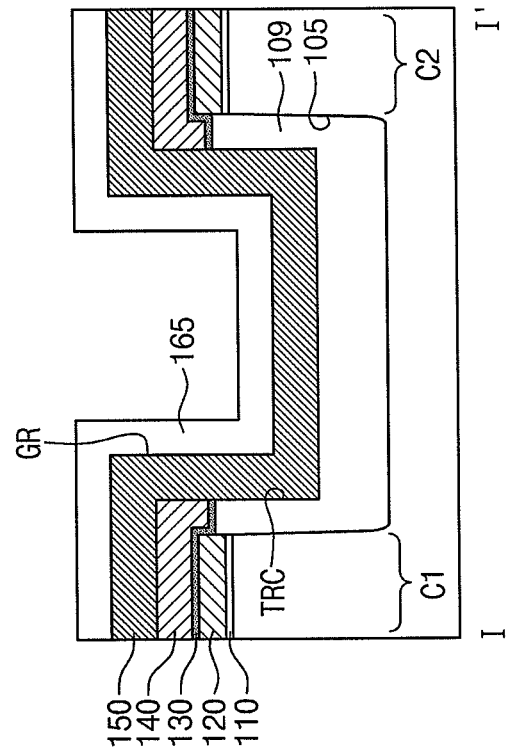

Referring to FIGS. 10A and 10B, a gate line structure may be formed on the cell array region by sequentially patterning the capping layer 160, the second conductive layer 150, the first conductive layer 140, the gate interlayer insulation layer 130, and the floating gate conductive layer 120. This operation may include forming the capping pattern 165 to expose the top surface of the second conductive layer 150 and forming a gate line structure by using the capping pattern 165 as an etching mask.

The gate line structure may include a string selection line SSL that may be used as a gate electrode of a string selection transistor SST, a ground selection line GSL that may be used as a gate electrode of a ground selection transistor, and a plurality of word lines WL that may be used as a gate electrode of a memory cell transistor MCT disposed therebetween.

In some embodiments, the capping pattern 165 may be formed crossing over the device isolation layer pattern 109 in the resistor region, and the second conductive layer 150 of the resistor region may be formed crossing over the trench TRC as shown in FIGS. 2 and 6.

Referring to FIG. 10B, an impurity region 170 may be formed in the semiconductor substrate 100 by using the gate line structure as an ion mask. The impurity region 170 may form a current path that connects the memory cell transistors MCT to the string selection transistor SST and the ground selection transistor serially.

Figure 11A:
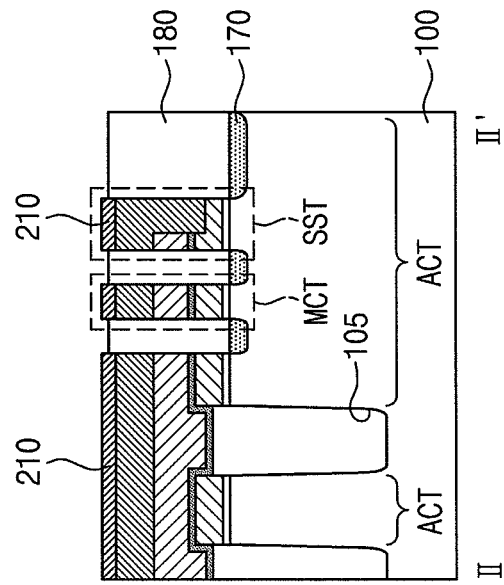
Figure 11B:
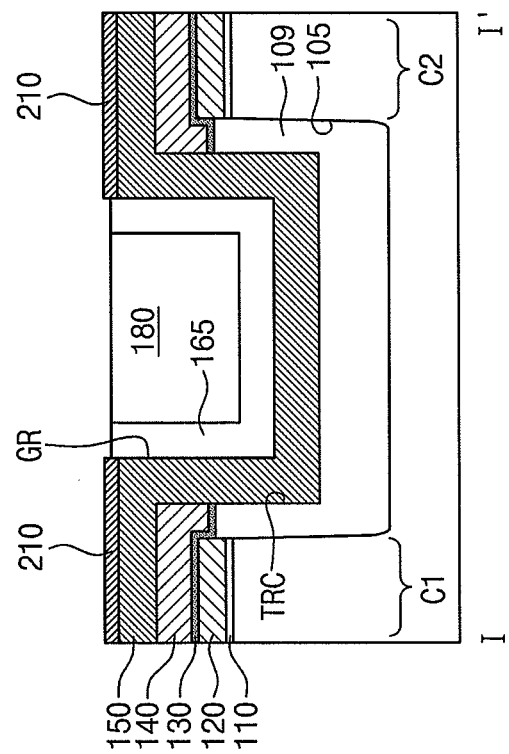

Referring to FIGS. 11A and 11B, the filling insulation layer 180 may be formed on the semiconductor substrate 100 including the impurity regions 170. The filling insulation layer 180 and the capping pattern 165 may be etched to expose the top surface of the second conductive layer 150. The conductive pattern 210 may be formed on the exposed top surface of the second conductive layer 150.

The filling insulation layer 180 may include, e.g., a silicon oxide layer, a silicon oxide nitride layer, a silicon nitride layer, and/or a low-k layer. The filling insulation layer 180 may be formed using a deposition technique that provides excellent step coverage, e.g., chemical vapor deposition, spin-on-glass technique.

Exposing the top surface of the second conductive layer 150 may include etching the filling insulation layer 180 by using chemical-mechanical polishing (CMP) and/or dry or wet etch-back and removing the capping pattern 165 on the second conductive layer 150 by using, e.g., CMP and/or dry or wet etch-back. The second conductive layer 150 of the resistor region may only be exposed around the gap region GR that may be filled by the capping pattern 165 and the filling insulation layer 180.

The conductive pattern 210 may be formed of a material that may realize an ohmic contact property between the conductive pattern 210 and the second conductive layer 150. According to an embodiment, the conductive pattern 210 may include silicide compounds, e.g., WxSi, TixSi, CoxSi, which may be foamed through a self-aligned silicide formation process. The self-aligned silicide formation process may include forming a metal layer, forming a silicide layer by a reaction of the metal atoms of the metal layer and silicon atoms of the second conductive layer 150, and removing a metal layer that does not participate in the silicidation reaction. Furthermore, after forming the silicide layer, a thermal treatment operation may be performed to reduce a resistivity of the silicide. In this case, the conductive pattern 210 may be selectively formed around the gap region GR where the second conductive layer 150 is exposed. In some embodiments, the conductive pattern 210 may be formed through the metal layer deposition operation and the metal layer patterning operation. In such cases, the metal layer patterning operation may include removing the metal layer deposited on the top surface of the gap region GR.

Figure 12A:
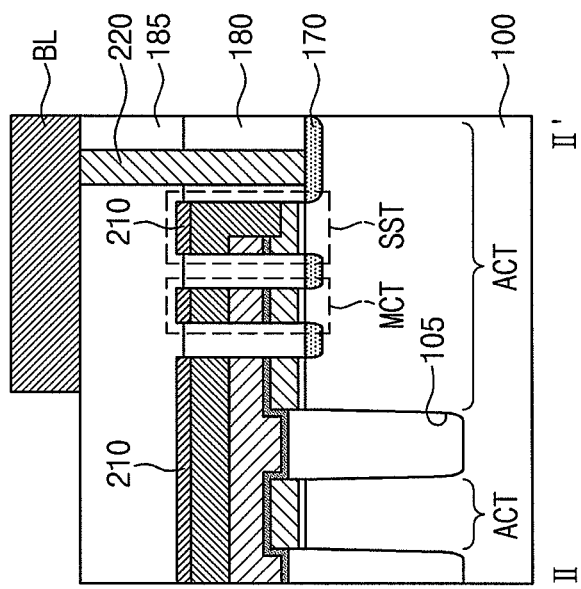
Figure 12B:
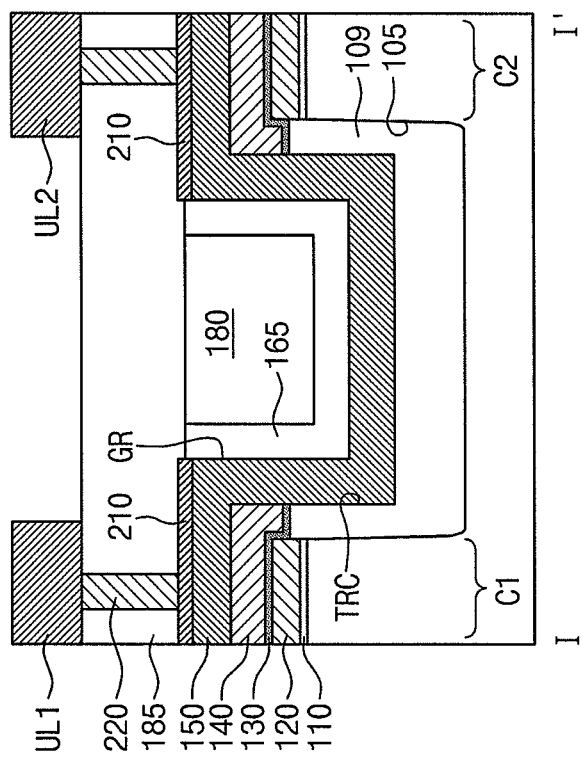

Referring to FIGS. 12A and 12B, after an interlayer insulation layer 185 is formed on the semiconductor substrate 100 including the conductive pattern 210, the plugs 220 penetrating the interlayer insulation layer 185 and the lines, e.g., UL1, UL2, contacting the plugs 220 may be formed.

The plugs 220 may contact the conductive pattern 210 or the impurity region 170, and the lines may include first and second upper lines UL1 and UL2 in the resistor region and bit lines BL in the memory cell array region. The first and second upper lines UL1 and UL2 may be connected to the conductive patterns 210 in the first and second connection regions C1 and C2 of the resistor region through the plugs 220, and the bit lines BL may be connected to the plugs 220 contacting the impurity regions 170 of the memory cell array region.

Again, referring to FIGS. 5, 6, 12A and 12B, the semiconductor device according to the second embodiment based on the technical scope of the inventive concept may include a cell array structure and a resistor structure, which may be formed in the cell array region and the resistor region of the semiconductor substrate 100, respectively.

The resistor structure may include at least one resistance pattern RP crossing over the trench TRC and conductive patterns 210 that may be locally formed in a predetermined region of the resistance pattern RP. The resistance pattern RP may be a polycrystalline silicon layer and the conductive patterns 210 may be a silicide layer. According to the embodiment described with reference to FIGS. 12A and 12B, the trench TRC may correspond to a recess region including bottom and sidewalls on a top surface of the device isolation layer pattern 109, and the resistance pattern RP for the resistor may be formed of the second conductive layer 150.

The resistance pattern RP may include respectively-spaced first and second contact regions CR1 and CR2 and a body region BD therebetween. The top surface of the body region BD may be formed substantially lower, relative to the z-axis, than the top surfaces of the first and second contact regions CR1 and CR2. As a result, a gap region GR defined by the body region BD may exist between the first and second contact regions CR1 and CR2. The gap region GR may be filled with the insulation materials 165 and 180.

A height difference between a top surface of the body region BD and those of the first and second contact regions CR1 and CR2 may be realized using the mold pattern MLDP described with reference to FIG. 1. For example, the device isolation layer pattern 109 having the top surface where the trench TRC is formed may be used as a mold pattern for realizing the above height difference. Furthermore, according to the embodiment described with reference to FIGS. 12A and 12B, the patterned thin layers 110, 120, 130, and 140 disposed between the semiconductor substrate 100 and the second conductive layer 150 may be used as the mold pattern MLDP.

The conductive patterns 210 may be locally formed on the first and second contact regions CR1 and CR2 of the resistance pattern RP, respectively. That is, the conductive patterns 210 may not be formed on the body region BD of the resistance pattern RP. Accordingly, an entire resistance value of a resistor may be at least dominantly, if not completely, determined by a resistance value of the body region BD of the resistance pattern RP. That is, influence of the contact resistance between the plug 220 and the resistance pattern RP, with respect to the entire resistance value of the resistors, may be reduced. A resistance value of the body region BD may be controlled by adjusting at least one of a resistivity of the second conductive layer 150, a thickness of the second conductive layer 150, and a distance between the first and second connection regions C1 and C2. The resistivity of the second conductive layer 150 may be adjusted by controlling a crystal structure and impurity concentration.

Figure 13:
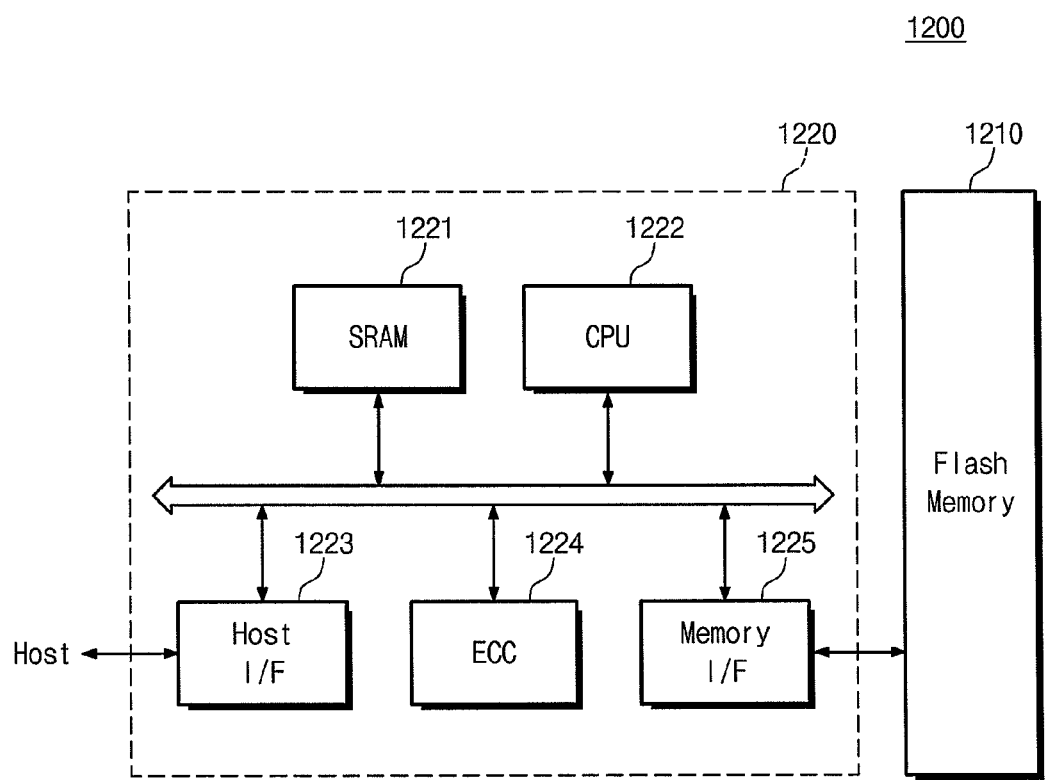
FIG. 13 illustrates a block diagram of a memory card equipped with a flash memory device according to an embodiment of the inventive concept.

FIG. 13 illustrates a block diagram of a memory card 1200 equipped with a flash memory device according to an embodiment of the inventive concept. Referring to FIG. 13, the memory card 1200 may be adapted to support high-capacity data storage, e.g., a flash memory device 1210. The memory card 1200 may include a memory controller 1220 for controlling general data exchanges between a host and the flash memory device 1210.

A SRAM 1221 may be used as an operating memory of a central processing unit (CPU) 1221. A host interface (I/F) 1223 may include a data exchange protocol of a host connected to the memory card 1200. An error correction code (ECC) block 1224 may detect and correct an error in data read from the multi-bit flash memory device 1210. A memory interface (I/F) 1225 may interface with the flash memory device 1210. The processing unit 1222 may perform a general control operation for data exchange of the memory controller 1220. Although not illustrated in the drawings, it is apparent to those skilled in the art that the memory card 1200 may further include ROM (not shown) for storing code data to interface with a host.

According to the above flash memory device and memory card or memory system, a highly reliable memory system can be provided through the flash memory device 1210 where erase properties of dummy cells may be improved. Especially, the flash memory device of the inventive concept may be provided in a memory system such as a solid state disk (SSD) that is currently actively in process. In this case, by preventing read errors caused by dummy cells, a highly reliable memory system can be realized.

Figure 14:
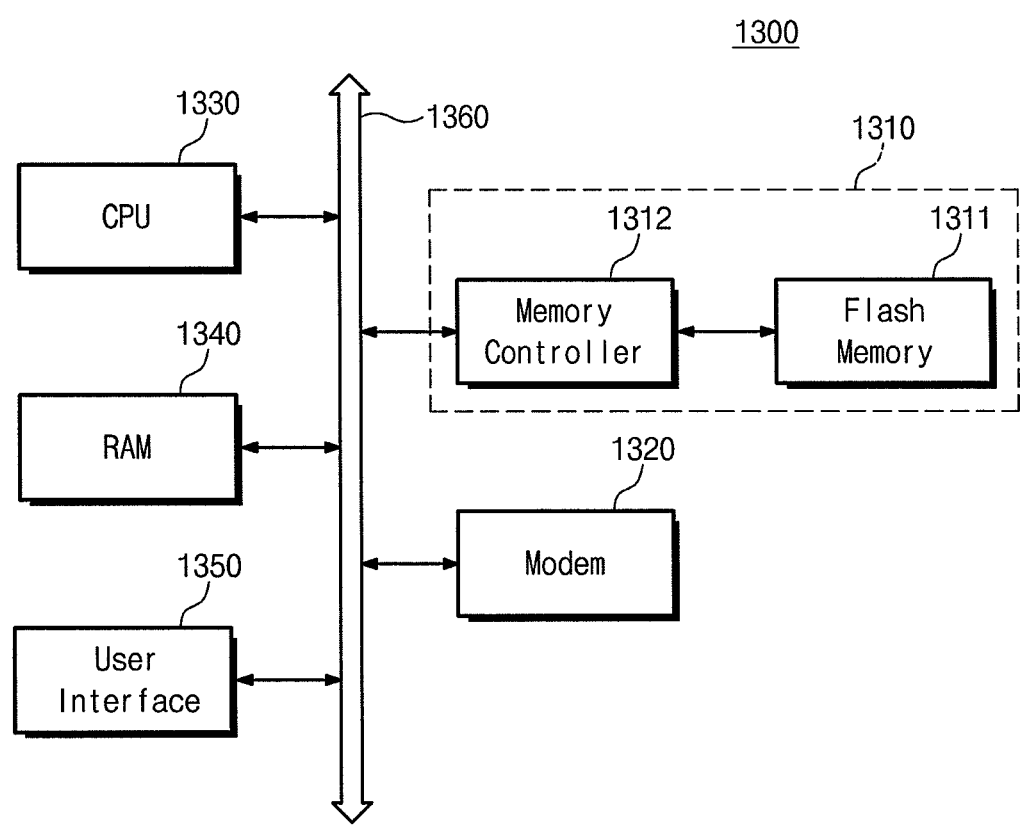
FIG. 14 illustrates a block diagram of an information processing system equipped with a flash memory system according to an embodiment of the inventive concept.

FIG. 14 illustrates a block diagram of an information processing system 1300 equipped with a flash memory system 1310. Referring to FIG. 14, the flash memory system 1310 of the inventive concept may be mounted on the information processing system 1300 such as a mobile device or a desktop computer. The information processing system 1300 may include a flash memory system 1310, a modem 1320, a central processing unit (CPU) 1330, a RAM 1340, and a user interface 1350, which may be connected to a system bus 1360. The flash memory system 1310 may have the same configuration as the above mentioned memory system or flash memory system. The flash memory system 1310 may store data processed by the CPU 1330 or externally input data. Here, the flash memory system 1310 may include SSD, and in that case, the information processing system 1300 can stably store a high capacity data in the flash memory system 1310. Moreover, as its reliability is enhanced, the flash memory system 1310 may save a resource consumed for an error correction, such that a high speed data exchange function may be provided to the information processing system 1300. Although not illustrated in the drawings, it is apparent to those skilled in the art that the information processing system 1300 may further include an application chipset, a camera image processor (CIS), and an input/output device.

In addition, the flash memory device or the memory system of the inventive concept may be mounted using various kinds of packages. Examples of the packages of the flash memory device or the memory system include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Embodiments may provide a resistor that is formed using a step difference provided by a trench. The resistor may include a resistance pattern and conductive patterns formed on the both ends of the resistance pattern. The resistance pattern may include a body region between respectively spaced contact regions. The conductive patterns may have a lower resistivity than the resistance pattern and may be formed on the contact regions. Accordingly, a contact resistance between the lines and the resistance pattern may be reduced.

Furthermore, the conductive patterns may be locally formed on the both ends of the resistance pattern using a step difference provided by the trench. Accordingly, an entire resistance value of a resistance value according to this embodiment may be dominantly determined by a resistance value of the body region of the resistance pattern and influence of the contact resistance with respect to an entire resistance value of a resistor can be reduced.

According to other embodiments based on the technical ideas of the inventive concept, a resistance pattern may be formed using process operations for manufacturing a flash memory device. In such embodiments, the resistance pattern may be manufactured while additional manufacturing processes may be minimized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising:
a mold pattern disposed on a semiconductor substrate to define a trench;
a resistance pattern including a body region and first and second contact regions, the body region covering a bottom and sidewalls of the trench, the first and second contact regions extending from the body region over upper surfaces of the mold pattern, respectively;
an insulation layer structure covering the body region and exposing top surfaces of the first and second contact regions; and
first and second lines contacting the first and second contact regions, respectively,
wherein:
the top surfaces of the first and second contact regions are higher than a top surface of a middle portion of the body region,
bottom surfaces of the first and second contact regions are higher than a bottom surface of the middle portion of the body region, and
the first and second contact regions are below the respective first and second lines.

2. The semiconductor device as claimed in claim 1, further comprising:
a first conductive pattern disposed between the first line and the first contact region; and
a second conductive pattern disposed between the second line and the second contact region.

3. The semiconductor device as claimed in claim 1, wherein:
bottom and sidewalls of the body region define a gap region on the trench,
the insulation layer fills the gap region, and
the middle portion of the body region is below an upper surface of the semiconductor substrate.

4. The semiconductor device as claimed in claim 1, wherein:
the semiconductor substrate includes a resistance region where the resistance pattern is formed and a cell array region where memory cells are formed;
the memory cell includes a lower gate structure and a upper gate structure, which are sequentially stacked on the semiconductor substrate; and
the lower gate structure includes a tunnel insulation layer and a floating gate electrode, which are sequentially stacked.

5. semiconductor device as claimed in claim 4, further comprising:
a device isolation layer disposed between the body region of the resistance pattern and the semiconductor substrate,
wherein the device isolation layer includes a middle portion below the body region and a sidewall extending from the middle portion to between the lower gate structure and the body region.

6. A semiconductor device, comprising:
a trench structure disposed on a semiconductor substrate, the trench structure including upper surfaces, wall surfaces, and a lower surface defining a trench;
a resistance pattern disposed on the trench structure, the resistance pattern including:
a body region covering at least a portion of the wall surfaces and the lower surface of the trench, and
first and second contact regions respectively covering the upper surfaces of the trench structure, wherein the body region is electrically coupled to the first and second contact regions of the resistance pattern, and bottom surfaces of the first and second contact regions are higher than a bottom surface of a middle portion of the body region; and
first and second lines contacting the first and second contact regions, respectively, wherein the resistance pattern defines a gap region between facing portions of the body region, and the first and second contact regions are below the respective first and second lines.

7. The semiconductor device as claimed in claim 6, further comprising:
a first conductive pattern disposed between the first line and the first contact region; and
a second conductive pattern disposed between the second line and the second contact region.

8. The semiconductor device as claimed in claim 7, wherein a resistance of the first and second conductive patterns is lower than a resistance of the resistance pattern.

9. The semiconductor device as claimed in claim 6, further comprising conductive plugs electrically coupling respective ones of the first and second contact regions to the first and second lines, respectively, the conductive plugs contacting only the corresponding first or second contact region of the resistance pattern.

10. The semiconductor device as claimed in claim 6, further comprising an insulation layer filling the gap region, wherein the middle portion of the body region is below an upper surface of the semiconductor substrate.

11. The semiconductor device as claimed in claim 6, wherein the trench structure corresponds to a device isolation layer pattern formed on the semiconductor substrate and at least one gate layer extends between at least a portion of the device isolation layer pattern and at least one of the first and second contact regions.

12. The semiconductor device as claimed in claim 11, wherein the at least one gate pattern includes a tunnel insulation layer, a floating gate conductive layer, a gate interlayer insulation layer, and/or a first conductive layer.

13. The semiconductor device as claimed in claim 7, wherein the first and second contact regions directly contact the first and second conductive patterns, respectively.

14. The semiconductor device as claimed in claim 13, wherein the device isolation layer pattern extends between the resistance pattern and the floating gate conductive layer and/or the tunnel insulation layer.

15. The semiconductor device as claimed in claim 6, wherein the resistance pattern is U-shaped.

16. The semiconductor device as claimed in claim 2, wherein;
the resistance pattern includes a polycrystalline silicon layer and the first and second conductive patterns include a silicide layer.

17. A semiconductor device, comprising:
a semiconductor substrate;
a resistance pattern on the semiconductor substrate;
first and second contact regions on sides of the resistance pattern;
a body region formed between the first and second contact regions and recessed into the semiconductor substrate;

an insulation layer covering the body region and exposing top surfaces of the first and second contact regions;

first and second conductive patterns on the exposed top surfaces of the respective first and second contact regions, the first and second conductive patterns providing a lower resistivity than a resistivity of the body region, bottom surfaces of the first and second contact regions are higher than a bottom surface of a middle portion of the body region, and the first and second contact regions are below respective first and second lines contacting the first and second contact regions respectively.

18. The semiconductor device as claimed in claim 17, wherein the resistance pattern includes a polycrystalline silicon layer and the first and second conductive patterns include a silicide layer.

19. The semiconductor device as claimed in claim 17, further comprising a memory cell structure on the semiconductor substrate, wherein the memory cell structure includes a floating gate, a control gate, and a gate interlayer insulation layer between the floating gate and the control gate.

20. The semiconductor device as claimed in claim 19, wherein the first and second contact regions are formed over the memory cell structure.

* * * * *